(12) United States Patent
Zhang et al.

(10) Patent No.: US 9,535,469 B2
(45) Date of Patent: Jan. 3, 2017

(54) SERVER CABINET AND SERVER SYSTEM

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Guang-Yi Zhang, Shenzhen (CN); Tie-Shan Jiang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/670,715

(22) Filed: Mar. 27, 2015

(65) Prior Publication Data

US 2015/0277517 A1 Oct. 1, 2015

(30) Foreign Application Priority Data

Mar. 27, 2014 (CN) .......................... 2014 1 0118407

(51) Int. Cl.
  *G06F 1/16* (2006.01)
  *G06F 1/18* (2006.01)
  *H05K 5/02* (2006.01)
  *H05K 7/14* (2006.01)
  *H05K 5/00* (2006.01)
  *H05K 7/00* (2006.01)

(52) U.S. Cl.
  CPC ............ *G06F 1/189* (2013.01); *H05K 5/0221* (2013.01); *H05K 5/0239* (2013.01); *H05K 5/0247* (2013.01); *H05K 7/1492* (2013.01)

(58) Field of Classification Search
  CPC ................... G06F 1/16; G06F 1/1601–1/1611; G06F 1/1613–1/1698; G06F 1/18–1/189; H05K 5/00–5/069; H05K 7/00–7/186
  USPC ............... 361/756, 741, 686, 687, 688, 696, 697,361/787, 789, 794, 701–703, 709, 807–810,361/679.01–679.45, 679.55–679.61, 724–727,361/679.31–679.39; 348/787, 789, 794; 349/56–60; 312/223.1–223.3; 335/214, 335/219, 225, 228–230, 234, 250, 262, 274, 335/275, 285, 296, 302–306
  See application file for complete search history.

(56) References Cited

U.S. PATENT DOCUMENTS

| | | | | |
|---|---|---|---|---|
| 7,349,205 | B2 * | 3/2008 | Hall ..................... | G11B 33/128 349/58 |
| 7,821,596 | B2 * | 10/2010 | Tanaka .............. | G02F 1/133604 349/56 |
| 2003/0039094 | A1 * | 2/2003 | Sarkinen .............. | H05K 5/0017 361/679.27 |
| 2004/0190241 | A1 * | 9/2004 | Cyphers ............... | H05K 7/1457 361/829 |
| 2006/0268533 | A1 * | 11/2006 | Miller ..................... | H04Q 1/06 361/797 |
| 2007/0058344 | A1 * | 3/2007 | Baker .................. | G06F 1/1632 361/695 |

(Continued)

*Primary Examiner* — Anthony Haughton
*Assistant Examiner* — Razmeen Gafur
(74) *Attorney, Agent, or Firm* — Zhigang Ma

(57) ABSTRACT

A server cabinet includes a cabinet body having a side plate, a door pivotably coupled to a front side of the side plate, a power distribution unit mounted in the cabinet body, and a plurality of power supply units attached to an inner side of the door. The power supply units are electrically coupled with the power distribution unit and configured to be electrically coupled with a plurality of servers through a plural- (Continued)

ity of cables, the power supply units being detachable and replaceable in spite of minimal physical access through the partly-closed door.

14 Claims, 4 Drawing Sheets

(56) References Cited

U.S. PATENT DOCUMENTS

| | | | | |
|---|---|---|---|---|
| 2007/0247809 A1* | 10/2007 | McClure | ............... | G06F 1/20 361/695 |
| 2008/0013275 A1* | 1/2008 | Beckley | ............... | H05K 7/186 361/695 |
| 2008/0186043 A1* | 8/2008 | Beaman | ............... | G01R 31/2874 324/750.08 |
| 2008/0238270 A1* | 10/2008 | Wayman | ............... | H05K 7/186 312/199 |
| 2008/0239657 A1* | 10/2008 | Oyama | ............... | G06F 1/183 361/679.37 |
| 2009/0154159 A1* | 6/2009 | Graybill | ............... | F21K 9/00 362/249.02 |
| 2009/0303678 A1* | 12/2009 | Ishimine | ............... | G06F 1/20 361/679.48 |
| 2010/0172077 A1* | 7/2010 | Randall | ............... | H05K 7/1492 361/679.4 |
| 2010/0290604 A1* | 11/2010 | Wright | ............... | H05K 7/20945 379/102.04 |
| 2011/0019366 A1* | 1/2011 | Xu | ............... | H04Q 1/021 361/724 |
| 2011/0069450 A1* | 3/2011 | Adducci | ............... | H05K 7/186 361/692 |
| 2011/0267782 A1* | 11/2011 | Petrick | ............... | G06F 1/1628 361/724 |
| 2012/0014063 A1* | 1/2012 | Weiss | ............... | H05K 7/20163 361/697 |
| 2012/0069514 A1* | 3/2012 | Ross | ............... | H05K 7/20727 361/679.33 |
| 2012/0127656 A1* | 5/2012 | Driggers | ............... | G06F 1/183 361/679.47 |
| 2013/0003263 A1* | 1/2013 | Rasmussen | ............... | G06F 1/189 361/627 |
| 2013/0067248 A1* | 3/2013 | Wang | ............... | G06F 1/189 713/300 |
| 2013/0107436 A1* | 5/2013 | Li | ............... | H05K 7/1492 361/679.4 |
| 2013/0265714 A1* | 10/2013 | Tsao | ............... | G06F 1/181 361/679.53 |

* cited by examiner

SERVER CABINET AND SERVER SYSTEM

FIELD

The subject matter herein generally relates to electronic device housings.

BACKGROUND

Server cabinets are usually equipped with numbers of servers. To make it convenient for operators to maintain power supplies for the servers in the server cabinet, the power supplies are mounted in the front of the servers.

BRIEF DESCRIPTION OF THE DRAWINGS

Implementations of the present technology will now be described, by way of example only, with reference to the attached figures.

DETAILED DESCRIPTION

Figure 1:
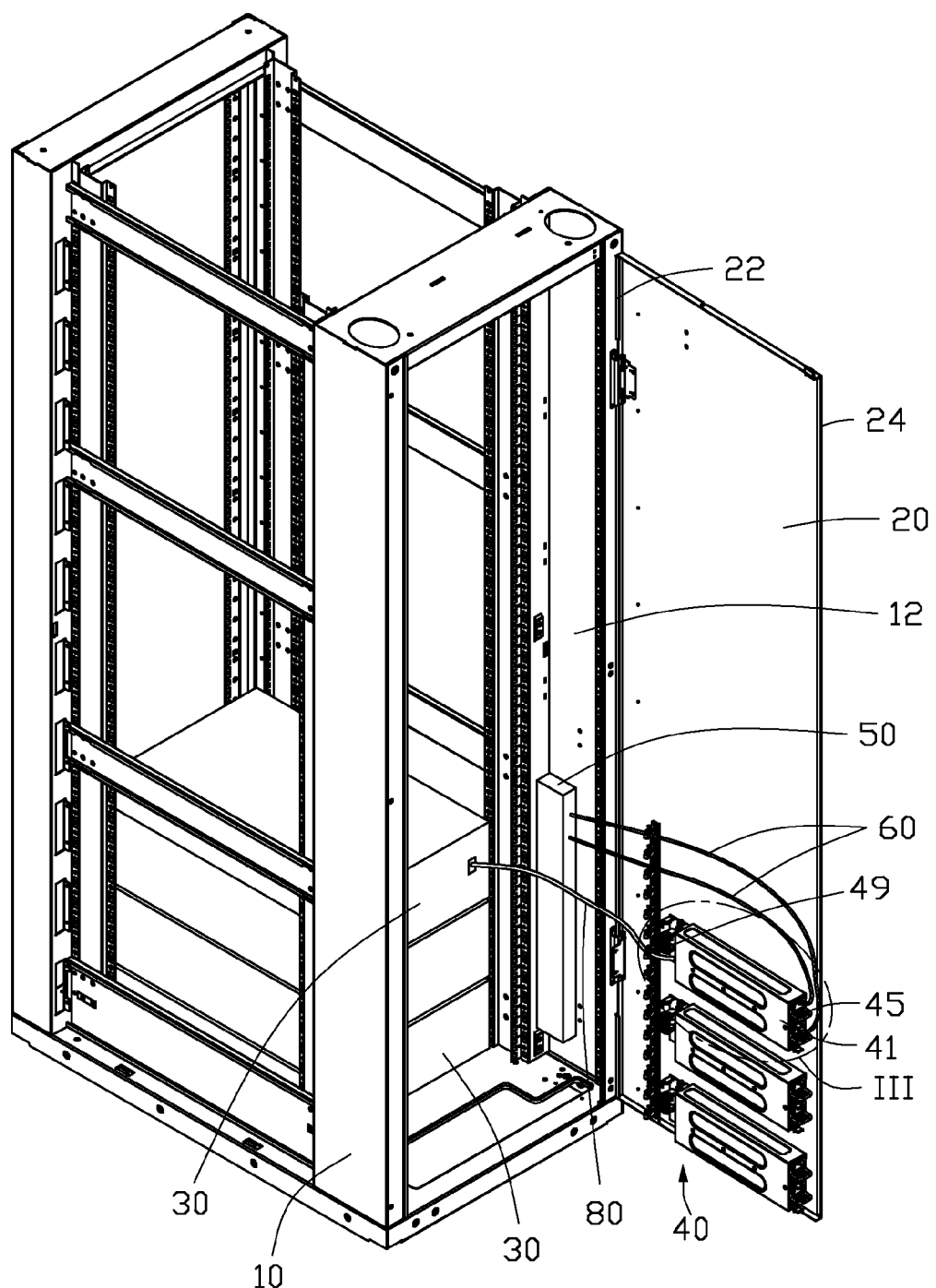
FIG. 1 is an assembled, isometric view of an embodiment of a server cabinet and a plurality of servers.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as coupled, whether directly or indirectly through intervening components, and is not necessarily limited to physical connections. The connection can be such that the objects are permanently coupled or releasably coupled. The term "comprising" means "including, but not necessarily limited to"; it specifically indicates open-ended inclusion or membership in a so-described combination, group, series and the like.

The present disclosure describes a server cabinet.

FIG. 1 illustrates that an embodiment of the server cabinet equipped with a plurality of servers 30 comprises a cabinet body 10, a door 20, a plurality of power supply units 40, and a power distribution unit 50.

The cabinet body 10 comprises a side plate 12. The door 20 comprises a first side edge 22 pivotably coupled to a front side of the side plate 12 and a second side edge 24 opposite to the first side edge 22. The servers 30 are mounted from top to bottom in the cabinet body 10. The power distribution unit 50 is attached to an inner side of the side plate 12.

Figure 2:
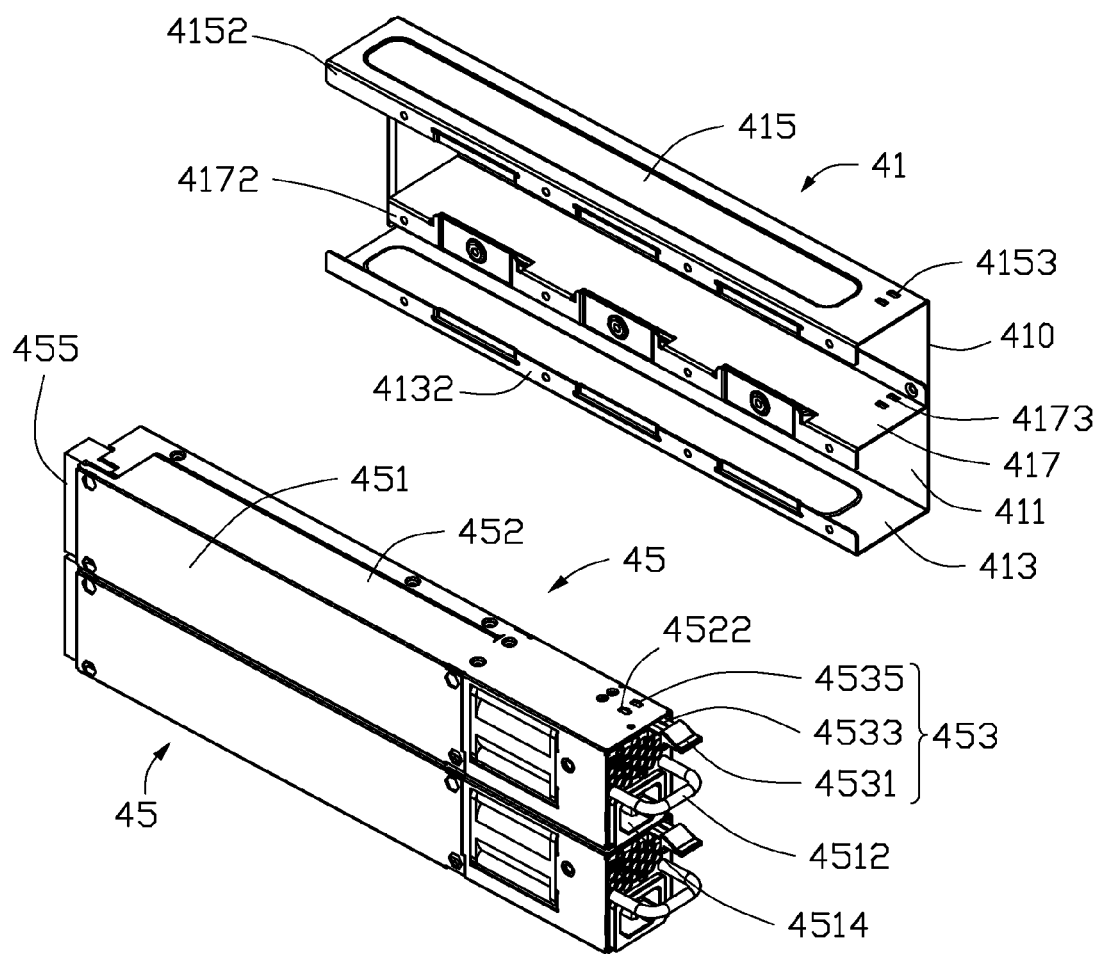
FIG. 2 is an inverted, exploded, isometric view of a power supply unit of the server cabinet of FIG. 1.
Figure 3:
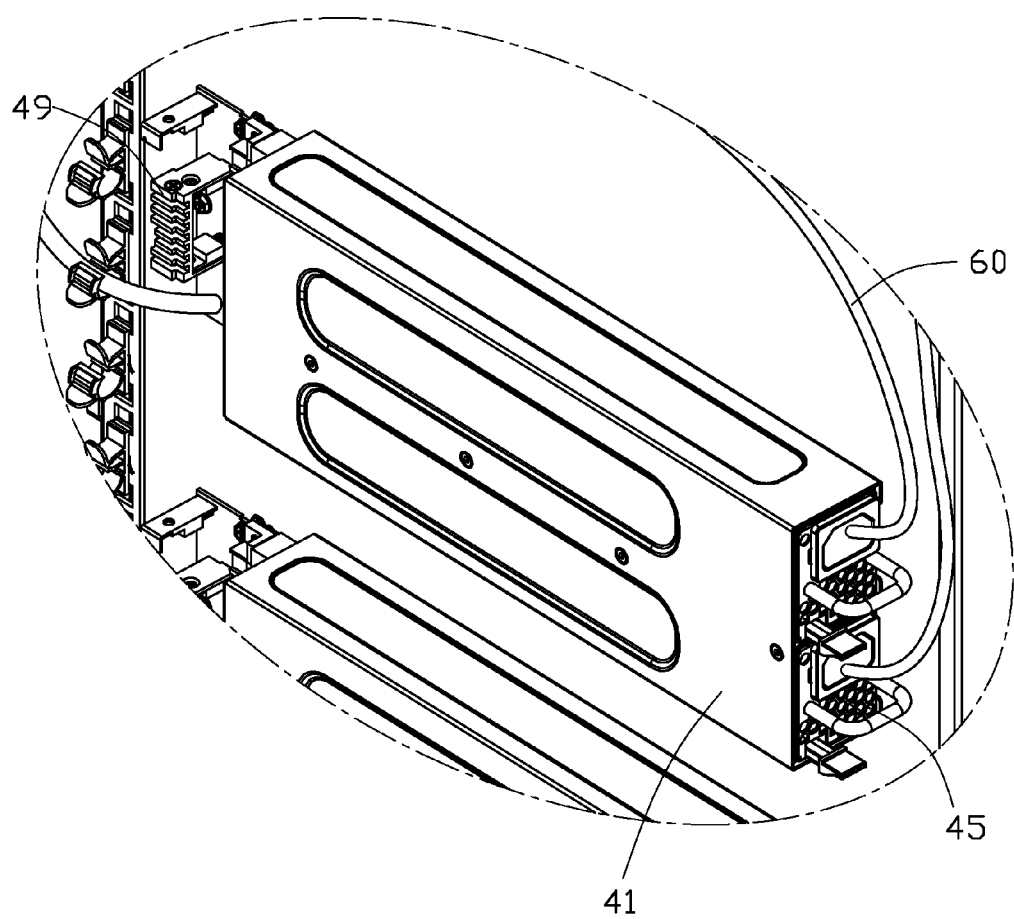
FIG. 3 is an enlarged view of a circled portion III of FIG. 1.

FIGS. 2 and 3 illustrate that each power supply unit 40 comprises a case 41, two power supplies 45 configured to be received in the case 41, and a power distribution board 49.

Each case 41 comprises a shield plate 411, a first side plate 413, and a second side plate 415 extending perpendicularly from two opposite sides of the shield plate 411. A partition plate 417 extends perpendicularly from a middle portion of the shield plate 411 and is parallel to the first side plate 413 and the second side plate 415. A fixing plate 4132 perpendicularly extends from a side away from the shield plate 411 of the first side plate 413 towards the second side plate 415. A fixing plate 4152 perpendicularly extends from a side away from the shield plate 411 of the second side plate 415 towards the first side plate 413. A fixing plate 4172 perpendicularly extends from a side away from the shield plate 411 of the partition plate 417 towards the first side plate 413. A pair of engaging holes 4173 is defined in the partition plate 417 near a first end 410 of the case 41. A pair of engaging holes 4153 is defined in the second side plate 415 near the first end 410 of the case 41.

Each power supply 45 comprises a main body 451 having a first end and a second end opposite to the first end, and a latching member 453. The main body 451 comprises a bottom wall 452, in which a pair of through holes 4522 is defined near the first end of the main body 451. The latching member 453 comprises an operating portion 4531 located outside of the main body 451 and an elastic sheet 4533. One end of the elastic sheet 4533 is attached to the bottom wall 452 and received in the main body 451, and the other end of the elastic sheet 4533 extends out of the first end of the main body 451 and is coupled to the operating portion 4531. The elastic sheet 4533 comprises a pair of latching portions 4535 configured to extend through the pair of through holes 4522. A handle 4512 and a power interface 4514 are formed on the first end of the main body 451. A connector 455 is formed on the second end of the main body 451.

Each power distribution board 49 comprises a pair of connectors.

In assembly, the power supply units 40 are attached to an inner side of the door 20 from top to bottom to correspond to the servers 30. To assemble each power supply unit 40, the power distribution board 49 of the power supply unit 40 is attached to the inner side of the door 20 near the first side edge 22 of the door 20. The fixing plate 4132, the fixing plate 4152, and the fixing plate 4172 of the case 41 of the power supply unit 40 are attached to the inner side of the door 20, while the first end 410 of the case 41 is near the second side edge 24 of the door 20. The first side plate 413 is located at the top and the second side plate 415 is located at the bottom. Two of the power supplies 45 can slide into the case 41 from the first end 410 of the case 41, and are supported on the second side plate 415 and the partition plate 417 of the case 41. When the two connectors 455 of the two power supplies 45 are coupled with the two connectors of the power distribution board 49, the two pairs of the latching portions 4535 of the two power supplies 45 engage in the pair of engaging holes 4153 and the pair of engaging holes 4173 of the case 41, to fix the two power supplies 45 in the case 41. The first end of each main body 451 is near the second side edge 24 of the door 20.

The two power interfaces 4514 of the two power supplies 45 of each power supply unit 40 are electrically coupled with the power distribution unit 50 through cables 60. The power distribution board 49 of each power supply unit 40 is electrically coupled with the corresponding server 30 through a cable 80, to supply electrical power to the server 30.

Figure 4:
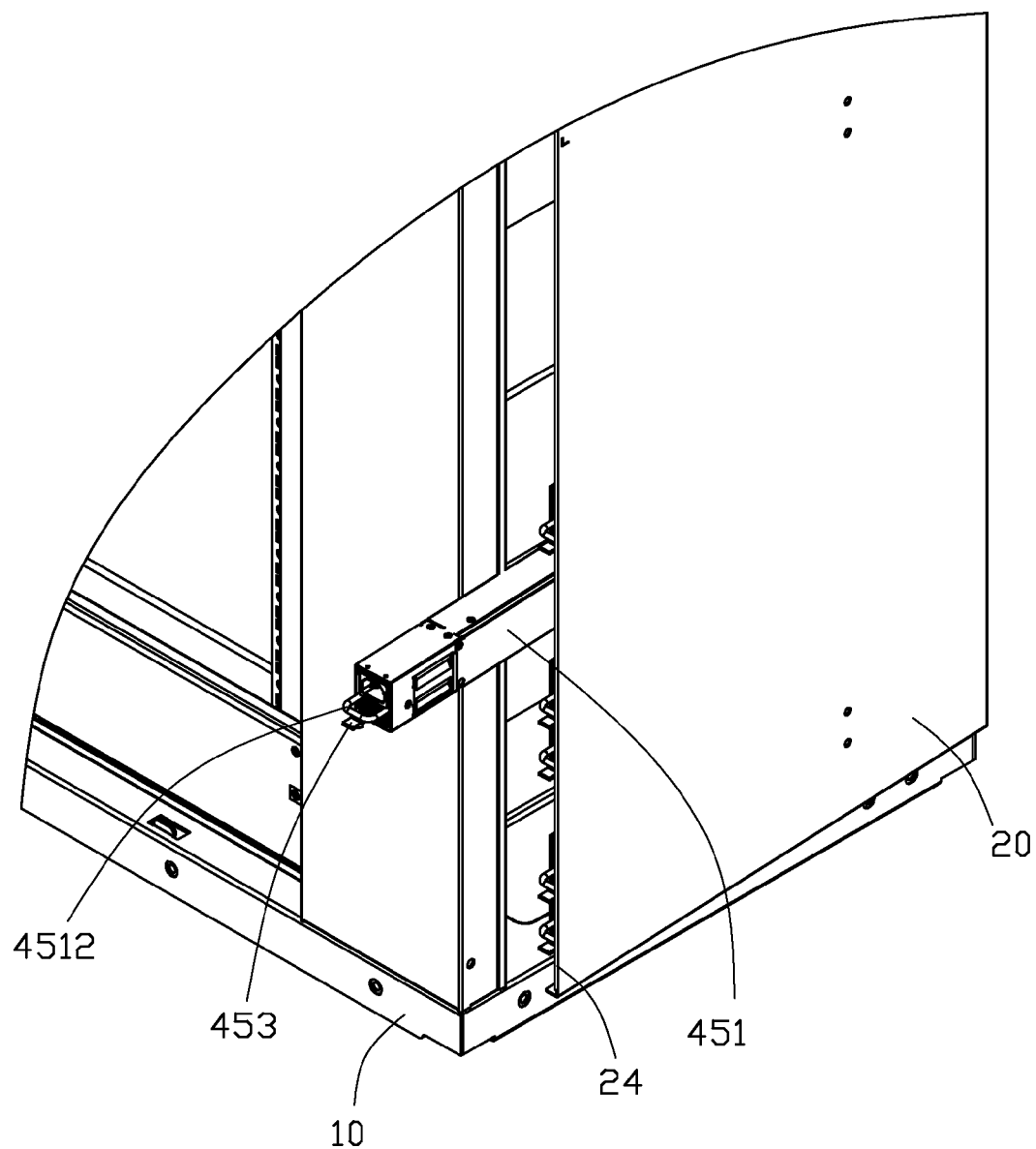
FIG. 4 is an assembled, isometric view of a part of the server cabinet and the servers of FIG. 1, wherein the server cabinet is in use.

FIG. 4 illustrates that each power supply 45 can be detached even when access is restricted by the door 20 being almost closed. In detail, the cable 60 is pulled out from the power supply 45. The operating portion 4531 of the latching member 453 of the power supply 45 is dragged upwards to disengage the pair of latching portions 4535 from the pair of engaging holes 4153 or the pair of engaging holes 4173. The power supply 45 can be detached from the corresponding case 41 though pulling on the handle 4512.

The embodiments shown and described above are only examples. Many details are often found in the art such as the other features of a server cabinet. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A server cabinet comprising:
a cabinet body, the cabinet body having a side plate;
a door, the door pivotably coupled to a front side of the side plate;
a power distribution unit, the power distribution unit mounted in the cabinet body; and
a plurality of power supply units, each of the plurality of power supply units attached to an inner side of the door, and each of the plurality of power supply units electrically coupled to the power distribution unit and a plurality of servers through a plurality of cables;
wherein each power supply unit comprises a case attached to the inner side of the door and at least one power supply, wherein the case defines at least one engaging hole; and each power supply comprises a main body and a latching member, wherein the latching member comprises an operating portion extending from the main body and engaging with the engaging hole.

2. The server cabinet of claim 1, wherein the latching member is coupled to the main body.

3. The server cabinet of claim 1, wherein the door comprises a first side edge pivotably coupled to the front side of the side plate, and a second side edge opposite to the first side edge; the main body comprises a first end near the second side edge, and the latching member further comprises an elastic sheet with one end attached to the main body and the other end extending out of the first end of the main body and coupled to the operating portion, wherein at least one latching portion extends through a bottom wall of the main body to engage with the engaging hole extending from the elastic sheet.

4. The server cabinet of claim 3, wherein a handle extends from the first end of the main body.

5. The server cabinet of claim 2, wherein each case comprises a shield plate, a first side plate, a second side plate extending perpendicularly from two opposite sides of the shield plate, and a partition plate extending perpendicularly from a middle portion of the shield plate and parallel to the first side plate and the second side plate, each power supply unit comprises two said power supplies configured to be supported on the corresponding partition plate and second side plate.

6. The server cabinet of claim 5, wherein the case further comprises three fixing plates, the three fixing plates are attached to the inner side of the door and extend from the opposite sides of the first side plate, the second side plate, and the partition plate.

7. The server cabinet of claim 5, wherein each one of the second side plate and partition plate defines at least one said engaging hole.

8. A server system comprising:
a cabinet body, the cabinet body having a side plate;
a plurality of servers, the plurality of servers mounted in the cabinet body;
a door, the door pivotably coupled to a front side of the side plate;
a power distribution unit mounted in the cabinet body; and
a plurality of power supply units, each of the plurality of power supply units attached to an inner side of the door, the plurality of power supply units electrically coupled to the power distribution unit and the plurality of servers through a plurality of cables;
wherein each power supply unit comprises a case attached to the inner side of the door and at least one power supply received in the case, wherein the case defines at least one engaging hole; and each power supply comprises a main body and a latching member, wherein the latching member comprises an operating portion extending from the main body and engaging with the engaging hole.

9. The server system of claim 8, wherein the latching member is coupled to the main body.

10. The server system of claim 9, wherein the door comprises a first side edge pivotably coupled to the front side of the side plate, and a second side edge opposite to the first side edge; the main body comprises a first end near the second side edge, and the latching member further comprises an elastic sheet with one end attached to the main body and the other end extending out of the first end of the main body and coupled to the operating portion, wherein at least one latching portion extends through a bottom wall of the main body to engage with the engaging hole extending from the elastic sheet.

11. The server system of claim 10, wherein a handle extends from the first end of the main body.

12. The server system of claim 9, wherein each case comprises a shield plate, a first side plate, a second side plate extending perpendicularly from two opposite sides of the shield plate, and a partition plate extending perpendicularly from a middle portion of the shield plate and parallel to the first side plate and the second side plate, each power supply unit comprises two said power supplies configured to be supported on the corresponding partition plate and second side plate.

13. The server system of claim 12, wherein the case further comprises three fixing plates, the three fixing plates are attached to the inner side of the door and extend from the opposite sides of the first side plate, the second side plate, and the partition plate.

14. The server system of claim 12, wherein each one of the second side plate and partition plate defines at least one said engaging hole.

* * * * *